United States Patent
Chiu et al.

(10) Patent No.: US 12,476,229 B2
(45) Date of Patent: Nov. 18, 2025

(54) ELECTRONIC PACKAGE

(71) Applicant: SILICONWARE PRECISION INDUSTRIES CO., LTD., Taichung (TW)

(72) Inventors: Chih-Hsien Chiu, Taichung (TW); Wen-Jung Tsai, Taichung (TW); Chi-Ching Ho, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 483 days.

(21) Appl. No.: 18/063,442

(22) Filed: Dec. 8, 2022

(65) Prior Publication Data
US 2024/0128249 A1 Apr. 18, 2024

(30) Foreign Application Priority Data
Oct. 14, 2022 (TW) .................................. 111139102

(51) Int. Cl.
| | |
|---|---|
| H01L 25/16 | (2023.01) |
| H01L 23/31 | (2006.01) |
| H01L 23/498 | (2006.01) |
| H01L 23/552 | (2006.01) |
| H01L 25/10 | (2006.01) |
| H01L 23/00 | (2006.01) |
| H01L 25/065 | (2023.01) |

(52) U.S. Cl.
CPC ........ *H01L 25/162* (2013.01); *H01L 23/3128* (2013.01); *H01L 23/49816* (2013.01); *H01L 23/49833* (2013.01); *H01L 23/552* (2013.01); *H01L 25/105* (2013.01); *H01L 24/16* (2013.01); *H01L 25/0657* (2013.01); *H01L 2224/16227* (2013.01); *H01L 2225/0651* (2013.01); *H01L 2225/0652* (2013.01); *H01L 2225/1058* (2013.01); *H01L 2225/1076* (2013.01)

(58) Field of Classification Search
None
See application file for complete search history.

(56) References Cited

U.S. PATENT DOCUMENTS 11,152,331 B2 * 10/2021 Wang .................. H01L 23/5389

* cited by examiner

*Primary Examiner* — Long Pham
(74) *Attorney, Agent, or Firm* — Studebaker Brackett PLLC

(57) ABSTRACT

An electronic package is provided, in which a circuit structure is stacked on a carrier structure having a routing layer via support structures, where electronic elements are disposed on upper and lower sides of the circuit structure and the carrier structure, and the electronic elements and the support structures are encapsulated by a cladding layer, such that the electronic package can effectively increase the packaging density to meet the requirements of multi-functional end products.

11 Claims, 10 Drawing Sheets

ELECTRONIC PACKAGE

BACKGROUND

1. Technical Field

The present disclosure relates to a semiconductor package structure, and more particularly, to a double-sided packaging electronic package.

2. Description of Related Art

With the evolution of semiconductor packaging technology, semiconductor devices have developed different packaging types. In order to improve electrical functions and save packaging space, different three-dimensional packaging technologies such as Fan-Out Package on Package (FO PoP), etc., have been developed to cope with the greatly increased number of input/output ports on various chips, so that integrated circuits with different functions can be integrated into a single package structure. This packaging method can take advantage of the system-in-package (SiP) heterogeneous integration characteristics, and can integrate electronic elements with different functions, such as a memory, a central processing unit, a graphics processor, an image application processor, etc., via stacking to achieve system integration, which is suitable for various thin and light electronic products.

FIG. 1 is a schematic cross-sectional view of a conventional semiconductor package 1. As shown in FIG. 1, the semiconductor package 1 includes: a package substrate 10 provided with a semiconductor chip 11, a circuit structure 14 stacked on the package substrate 10 via conductive pillars 13, and an encapsulant 15 covering the semiconductor chip 11, so that a plurality of solder balls 17 are arranged on the bottom side of the package substrate 10, and a package module 9 is disposed on the circuit structure 14 via a plurality of conductive elements 18.

However, in the conventional semiconductor package 1, the space for arranging the semiconductor chip 11 is limited by the height of the conductive pillars 13, so that electronic elements of different specifications cannot be disposed on the package substrate 10.

Furthermore, although the height of the conductive pillars 13 can be increased to accommodate the semiconductor chip 11 with a higher height, the width of the conductive pillars 13 is also increased accordingly. Therefore, the layout areas of the conductive pillars 13 on the package substrate 10 will be increased, making it difficult to add other electronic elements on the package substrate 10.

Therefore, how to overcome the above-mentioned various problems of the prior art has become an urgent problem to be solved at present.

SUMMARY

In view of the various deficiencies of the prior art, the present disclosure provides an electronic package, comprising: a carrier structure having a routing layer and defined with a first side and a second side opposing the first side; a plurality of first electronic elements disposed on the first side and the second side of the carrier structure respectively and electrically connected to the routing layer; support structures disposed on the first side of the carrier structure and electrically connected to the routing layer; a circuit structure having a first surface and a second surface opposing the first surface and stacked on the first side of the carrier structure with the first surface via the support structures, wherein the support structures are electrically connected to the circuit structure, wherein a layout width of the circuit structure is less than a layout width of the carrier structure, such that an accommodating space is formed above the first side of the carrier structure; a plurality of second electronic elements disposed on the first surface and the second surface of the circuit structure respectively and electrically connected to the circuit structure; and a cladding layer formed on the first side and the second side of the carrier structure and on the first surface and the second surface of the circuit structure to encapsulate the plurality of first electronic elements, the plurality of second electronic elements and the support structures.

In the aforementioned electronic package, the present disclosure further comprises a functional element disposed in the accommodating space on the first side of the carrier structure, wherein the functional element is electrically connected to the routing layer, wherein a height of the functional element relative to the first side of the carrier structure is greater than a height of the support structures relative to the first side of the carrier structure.

In the aforementioned electronic package, the cladding layer is formed with a plurality of openings on the second surface of the circuit structure, such that partial areas on the second surface of the circuit structure are exposed from the plurality of openings for bonding a plurality of conductive elements.

In the aforementioned electronic package, the circuit structure is electrically connected to the routing layer of the carrier structure via at least one wire.

In the aforementioned electronic package, the support structures are further disposed on the second side of the carrier structure for stacking an electronic module.

In the aforementioned electronic package, the cladding layer is formed with a stepped portion at the accommodating space, wherein an upper surface of the stepped portion is lower than an upper surface of the cladding layer corresponding to the circuit structure, and a plurality of openings are formed on the upper surface of the stepped portion, such that part of the routing layer of the carrier structure is exposed from the plurality of openings. For example, the present disclosure further comprises a plurality of conductive elements disposed in the plurality of openings to connect to a package module, wherein the package module is electrically connected to the routing layer.

In the aforementioned electronic package, the cladding layer is formed on a partial surface of the first side of the carrier structure, such that the cladding layer is free from covering the accommodating space and is formed with a hollow area at the accommodating space.

In the aforementioned electronic package, the present disclosure further comprises a shielding structure formed on the cladding layer.

In the aforementioned electronic package, the support structures are solder balls, conductive pillars, or copper core balls.

In the aforementioned electronic package, the support structures are circuit boards, and the support structures are bonded to the routing layer on the first side of the carrier structure and the circuit structure via conductors.

As can be seen from the above, in the electronic package of the present disclosure, the layout width of the circuit structure is less than the layout width of the carrier structure, so that an accommodating space is formed above the first side of the carrier structure for arranging other functional elements. Therefore, compared with the prior art, the space for arranging the electronic elements of the present disclosure is not limited by the height of the support structures, so that electronic elements of different specifications can be arranged on the first side of the carrier structure according to requirements.

Furthermore, since the space for arranging the electronic elements is not limited by the height of the support structures, the width of the support structures can be designed to be miniaturized, so as to reduce the layout areas of the support structures on the first side of the carrier structure, so that other electronic elements can be added on the first side of the carrier structure according to requirements.

Furthermore, by using the design of double-sided compression molding for the cladding layer, a plurality of first electronic elements can be arranged on the first side and the second side of the carrier structure, and a plurality of second electronic elements can be arranged on the first surface and the second surface of the circuit structure, so that the electronic package of the present disclosure can effectively increase the packaging density to meet the requirements of multi-functional end products. In addition, by a four-sided compression molding for the cladding layer relative to the carrier structure and the circuit structure, the overall structural strength of the electronic package can be improved, so as to reduce the warpage of the multilayer stack structure.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "above," "on," "first," "second," "a," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

Figure 1:
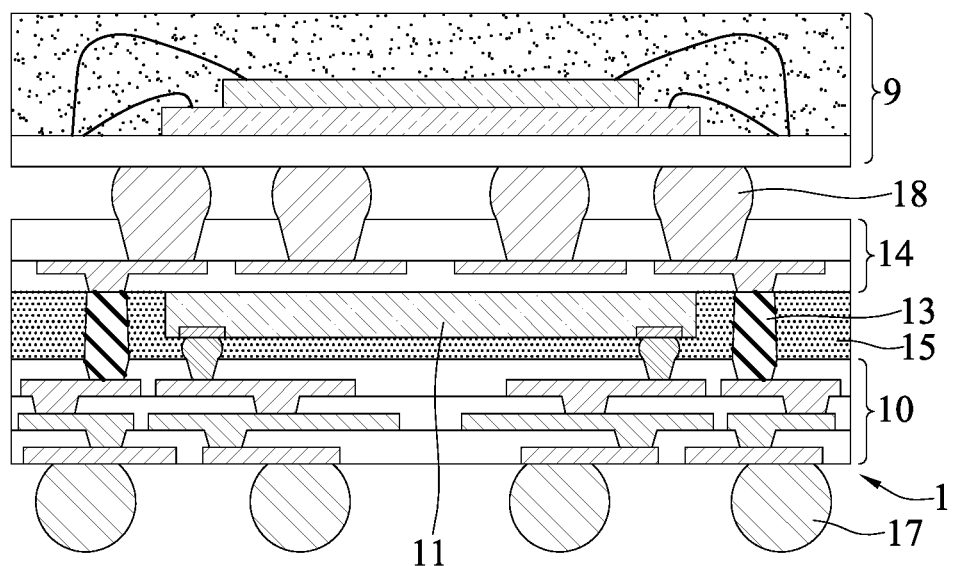
FIG. 1 is a schematic cross-sectional view of a conventional semiconductor package.
Figure 2A:
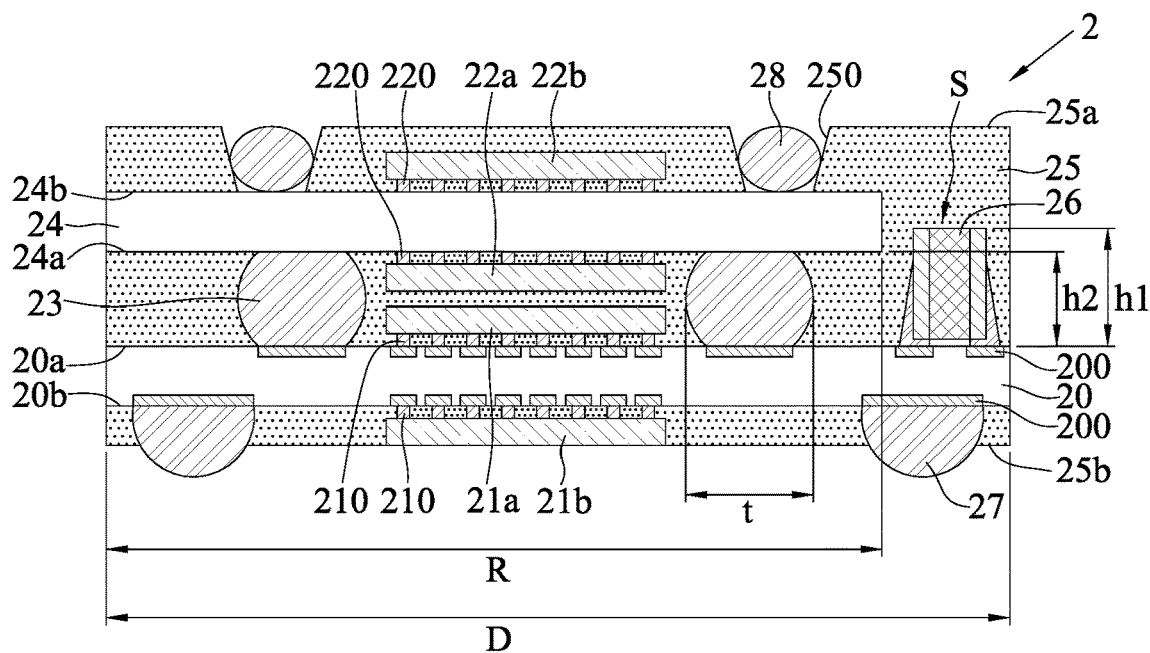
FIG. 2A is a schematic cross-sectional view of an electronic package according to a first embodiment of the present disclosure.

FIG. 2A is a schematic cross-sectional view of an electronic package 2 according to a first embodiment of the present disclosure. As shown in FIG. 2A, the electronic package 2 comprises: a carrier structure 20 having a routing layer 200, a plurality of first electronic elements 21a, 21b, a plurality of support structures 23 such as of solder ball specifications, a circuit structure 24, a plurality of second electronic elements 22a, 22b, and a cladding layer 25.

The carrier structure 20 is defined with a first side 20a and a second side 20b opposing the first side 20a. The first side 20a is used as a support side, and the second side 20b is used as a ball-placement side, so that a plurality of solder balls 27 are bonded to a portion of the routing layer 200 on the second side 20b.

In an embodiment, the carrier structure 20 is, for example, a package substrate with a core layer or a coreless package substrate. The carrier structure 20 has an insulating base and a routing layer 200 bonded to the insulating base, and the routing layer 200 is, for example, a fan-out type redistribution layer (RDL), wherein a routing/wiring layer (not shown) is also arranged inside the carrier structure 20 to conduct the routing layers 200 on the first side 20a and the second side 20b. For example, the material for forming the routing layer 200 is, for example, copper, and the material for forming the insulating base is dielectric material, for example, polybenzoxazole (PBO), polyimide (PI), prepreg (PP) and the like.

The plurality of first electronic elements 21a and 21b are disposed on the first side 20a and the second side 20b of the carrier structure 20 respectively and are electrically connected to the routing layers 200.

In an embodiment, the first electronic elements 21a, 21b are active elements, passive elements, or a combination of the two, etc., wherein the active elements are such as semiconductor chips, and the passive elements are such as resistors, capacitors and inductors. For example, if the first electronic elements 21a, 21b are semiconductor chips, the first electronic elements 21a, 21b can be disposed on the routing layers 200 via a plurality of conductive bumps 210 made of such as solder material in a flip-chip manner and can be electrically connected to the routing layers 200; alternatively, the first electronic elements 21a, 21b can be electrically connected to the routing layers 200 via a plurality of bonding wires (not shown) in a wire-bonding manner; or, the first electronic elements 21a, 21b can be directly electrically connected to the routing layers 200. However, there are many ways in which the first electronic elements 21a, 21b can be electrically connected to the carrier structure 20, and the present disclosure is not limited to the above.

The circuit structure 24 has a first surface 24a and a second surface 24b opposing the first surface 24a, so that the circuit structure 24 is disposed on the first side 20a of the carrier structure 20 with the first surface 24a via the support structures 23, and the support structures 23 are electrically connected to the circuit structure 24 and the routing layer 200.

In an embodiment, the circuit structure 24 is, for example, a package substrate with a core layer or a coreless package substrate. The circuit structure 24 has an insulating base and circuit layers (not shown) bonded to the insulating base, and the circuit layers are, for example, fan-out type redistribution layers (RDLs), wherein at least one circuit layer (not shown) is also arranged inside the circuit structure 24 to conduct the circuit layers on the first surface 24a and the second surface 24b. For example, the material for forming the circuit layers is, for example, copper, and the material for forming the insulating base is dielectric material, for example, polybenzoxazole (PBO), polyimide (PI), prepreg (PP) and the like.

Furthermore, a layout width R of the circuit structure 24 is less than a layout width D of the carrier structure 20, so that an accommodating space S is formed above the first side 20a of the carrier structure 20 for disposing other functional elements 26. For example, the functional element 26 may be a passive element and is electrically connected to the routing layer 200, and a height h1 of the functional element 26 relative to the first side 20a of the carrier structure 20 is greater than a height h2 of the support structures 23 relative to the first side 20a of the carrier structure 20. However, the functional element 26 is not limited by the circuit structure 24 and does not collide with the circuit structure 24. It should be understood that the height of the functional element 26 relative to the first side 20a of the carrier structure 20 may even be higher than the height of the circuit structure 24 relative to the first side 20a of the carrier structure 20, and the functional element 26 will still not be limited by the circuit structure 24 and will not collide with the circuit structure 24.

The plurality of second electronic elements 22a and 22b are disposed on the first surface 24a and the second surface 24b of the circuit structure 24 respectively and are electrically connected to the circuit structure 24.

In an embodiment, the second electronic elements 22a, 22b are active elements, passive elements, or a combination of the two, etc., wherein the active elements are such as semiconductor chips, and the passive elements are such as resistors, capacitors and inductors. For example, if the second electronic elements 22a, 22b are semiconductor chips, the second electronic elements 22a, 22b can be disposed on the circuit layers on the first surface 24a and the second surface 24b of the circuit structure 24 respectively via a plurality of conductive bumps 220 made of such as solder material in a flip-chip manner and can be electrically connected to the circuit layers; alternatively, the second electronic elements 22a, 22b can be electrically connected to the circuit layers via a plurality of bonding wires (not shown) in a wire-bonding manner; or, the second electronic elements 22a, 22b can directly contact the circuit layers. However, there are many ways in which the second electronic elements 22a, 22b can be electrically connected to the circuit structure 24, and the present disclosure is not limited to the above.

The cladding layer 25 is formed on the first side 20a and the second side 20b of the carrier structure 20 and on the first surface 24a and the second surface 24b of the circuit structure 24, so as to cover the first electronic elements 21a, 21b, the functional element 26, the second electronic elements 22a, 22b and the support structures 23.

In an embodiment, the cladding layer 25 is made from an insulating material, such as polyimide (PI), dry film, encapsulant such as epoxy resin, or molding compound. For example, the cladding layer 25 can be formed on the carrier structure 20 and the circuit structure 24 by means of liquid compound, injection, lamination, or compression molding.

Furthermore, the cladding layer 25 can be formed in one packaging operation to encapsulate the first electronic elements 21a, 21b, the second electronic elements 22a, 22b, and the support structures 23. Alternatively, the cladding layer 25 can be formed in multiple packaging operations, in which the first electronic elements 21a, 21b, the second electronic element 22a on the first surface 24a of the circuit structure 24, and the support structures 23 are encapsulated first, and the second electronic element 22b on the second surface 24b of the circuit structure 24 is then encapsulated.

In addition, the second electronic element 22b on the second surface 24b of the circuit structure 24 is free from being exposed from an upper surface 25a of the cladding layer 25, yet the solder balls 27 on the second side 20b of the carrier structure 20 and the first electronic element 21b are exposed from a lower surface 25b of the cladding layer 25. For example, the outer surface of the first electronic element 21b on the second side 20b of the carrier structure 20 is flush with the lower surface 25b of the cladding layer 25, and the solder balls 27 protrude from the lower surface 25b of the cladding layer 25. It should be understood that the second electronic element 22b on the second surface 24b of the circuit structure 24 can also be exposed from the upper surface 25a of the cladding layer 25 according to requirements. For example, the surface of the second electronic element 22b on the second surface 24b of the circuit structure 24 is flush with the upper surface 25a of the cladding layer 25, but the present disclosure is not limited to as such.

In addition, a plurality of openings 250 are formed on the cladding layer 25 on the second surface 24b of the circuit structure 24, so that partial areas (such as part of the circuit layer) on the second surface 24b of the circuit structure 24 are exposed from the openings 250 for bonding a plurality of conductive elements 28 made of such as solder material to connect other elements, and the conductive elements 28 are electrically connected to the circuit layer of the circuit structure 24. As shown in FIG. 5C, a package module 5a can be bonded to the conductive elements 28 via conductors 500 made of such as solder material, so that the package module 5a is stacked on the cladding layer 25.

The package module 5a comprises a package substrate 50 bonded with and electrically connected to the conductive elements 28 via the conductors 500, semiconductor chips 51 electrically connected to the package substrate 50, and an encapsulant 52 encapsulating the semiconductor chips 51.

Therefore, in the electronic package 2 of the present disclosure, the layout width R of the circuit structure 24 is less than the layout width D of the carrier structure 20, so that an accommodating space S is formed above the first side 20a of the carrier structure 20 to accommodate other functional elements 26. Therefore, compared with the prior art, the space for arranging the electronic elements (such as the first electronic element 21a, the second electronic element 22a and the functional element 26) of the present disclosure is not limited by the height of the support structures 23, so that the electronic elements (such as the first electronic element 21a, the second electronic element 22a and the functional element 26) of different specifications can be arranged on the first side 20a of the carrier structure 20 according to requirements.

Furthermore, since the space for arranging the electronic elements (such as the first electronic element 21a, the second electronic element 22a and the functional element 26) is not limited by the height of the support structures 23, a width t of the support structures 23 can be designed to be miniaturized, so as to reduce the layout areas of the support structures 23 on the first side 20a of the carrier structure 20, such that other electronic elements (such as the first electronic element 21a or the functional element 26) can be added on the first side 20a of the carrier structure 20 according to requirements.

Furthermore, by using the design of double-sided compression molding (or double-sided assembly) for the cladding layer 25, a plurality of first electronic elements 21a, 21b can be arranged on the first side 20a and the second side 20b of the carrier structure 20 respectively, and a plurality of second electronic elements 22a, 22b can be arranged on the first surface 24a and the second surface 24b of the circuit structure 24 respectively, so that the electronic package 2 of the present disclosure can effectively increase the packaging density to meet the requirements of multi-functional end products. In addition, by a four-sided compression molding for the cladding layer 25 relative to the carrier structure 20 and the circuit structure 24, the overall structural strength of the electronic package 2 can be improved, so as to reduce the warpage of the multilayer stack structure.

Figure 2B:
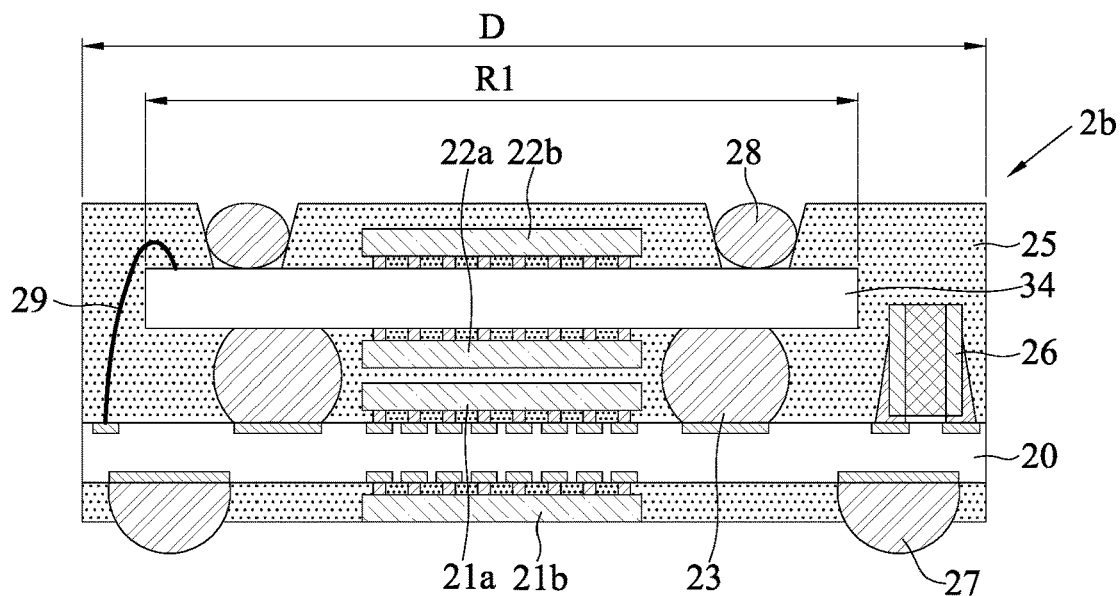
FIG. 2B and FIG. 2C are schematic cross-sectional views showing different aspects of electronic packages according to a second embodiment of the present disclosure.
Figure 2C:
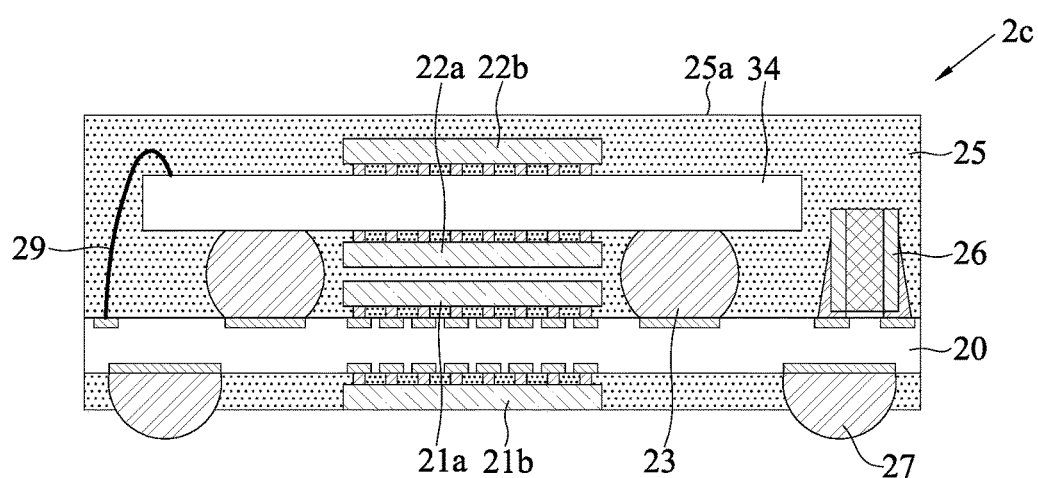

FIG. 2B and FIG. 2C are schematic cross-sectional views showing electronic packages 2b, 2c respectively according to a second embodiment of the present disclosure. The difference between the second embodiment and the first embodiment lies in the addition of a wire 29, and other structures between the first embodiment and the second embodiment are substantially the same, so the similarities will not be repeated.

As shown in FIG. 2B, a circuit structure 34 can be further electrically connected to the routing layer 200 of the carrier structure 20 via at least one wire 29.

In an embodiment, the wire 29 is a bonding wire such as a gold wire, and a layout width R1 of the circuit structure 34 is less than the layout width R of the circuit structure 24 of the first embodiment, so as to facilitate the wire-bonding operation for arranging the wire 29, and the cladding layer 25 can encapsulate the entire circuit structure 34 and the wire 29.

Furthermore, as shown in FIG. 2C, openings 250 may not be formed on the upper surface 25a of the cladding layer 25 according to requirements.

Therefore, in the electronic packages 2b, 2c of the embodiment, the wire 29 is used to replace part of the support structures 23 to increase an electrical connection path between the carrier structure 20 and the circuit structure 34. Moreover, because the number of the support structures 23 is reduced, the support structures 23 can be configured with a larger pitch specification.

Figure 3:
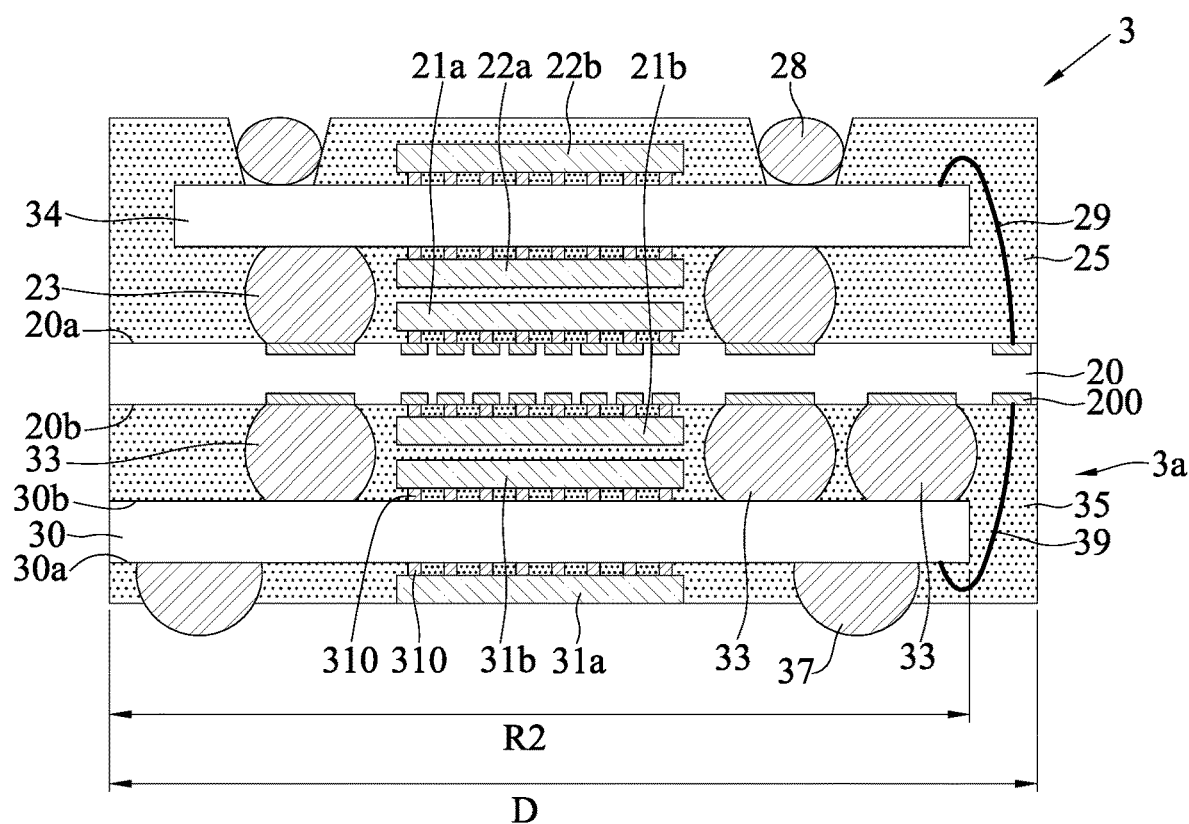
FIG. 3 is a schematic cross-sectional view of an electronic package according to a third embodiment of the present disclosure.

FIG. 3 is a schematic cross-sectional view of an electronic package 3 according to a third embodiment of the present disclosure. The difference between the third embodiment and the above-mentioned embodiments is that an electronic module 3a is added, and other structures between the third embodiment and the above-mentioned embodiments are substantially the same, so the similarities will not be repeated.

As shown in FIG. 3, an electronic module 3a can be stacked on the second side 20b of the carrier structure 20 via a plurality of support structures 33, and the electronic module 3a comprises a routing structure 30, a plurality of third electronic elements 31a, 31b and an encapsulation layer 35.

The routing structure 30 is, for example, a package substrate with a core layer or a coreless package substrate, wherein the inner side 30b of the routing structure 30 can be electrically connected to the routing layer 200 of the carrier structure 20 via the support structures 33, and the outer side 30a of the routing structure 30 can be electrically connected to the routing layer 200 via a wire 39 such as a gold wire.

In an embodiment, the layout width R2 of the routing structure 30 is less than the layout width D of the carrier structure 20, so as to facilitate the wiring operation for arranging the wire 39.

Furthermore, no other functional elements 26 are disposed above the first side 20a and the second side 20b of the carrier structure 20, and the outer side 30a of the routing structure 30 to which the second side 20b of the carrier structure 20 is connected is used as a ball-placement side, and the plurality of solder balls 37 are arranged on the outer side 30a of the routing structure 30.

The plurality of third electronic elements 31a, 31b are disposed on the outer side 30a and the inner side 30b of the routing structure 30 respectively and are electrically connected to the routing structure 30.

In an embodiment, the third electronic elements 31a, 31b are active elements, passive elements, or a combination of the two, etc., wherein the active elements are such as semiconductor chips, and the passive elements are such as resistors, capacitors and inductors. For example, if the third electronic elements 31a, 31b are semiconductor chips, electrode pads (not shown) of the third electronic elements 31a, 31b can be disposed on the routing structure 30 via a plurality of conductive bumps 310 made of such as solder material in a flip-chip manner and are electrically connected to the routing structure 30; alternatively, the electrode pads of the third electronic elements 31a, 31b can be electrically connected to the routing structure 30 via a plurality of bonding wires (not shown) in a wire-bonding manner; or, the electrode pads of the third electronic elements 31a, 31b can be directly electrically connected to the routing structure 30. However, there are many ways in which the third electronic elements 31a, 31b can be electrically connected to the routing structure 30, and the present disclosure is not limited to the above.

The encapsulation layer 35 encapsulates the third electronic elements 31a, 31b, the first electronic element 21b on the second side 20b of the carrier structure 20, the support structures 33 and the wire 39.

In an embodiment, the encapsulation layer 35 is made from an insulating material, such as polyimide (PI), dry film, encapsulant such as epoxy resin, or molding compound. For example, the encapsulation layer 35 can be formed on the carrier structure 20 and the routing structure 30 by means of liquid compound, injection, lamination, or compression molding. It should be understood that the material of the encapsulation layer 35 and the material of the cladding layer 25 may be the same or different.

Furthermore, the third electronic element 31a and the solder balls 37 on the outer side 30a of the routing structure 30 are exposed from the encapsulation layer 35. For example, the exposed surface of the third electronic element 31a is flush with the surface of the encapsulation layer 35, and the solder balls 37 protrude from the encapsulation layer 35. It should be understood that the third electronic element 31a may be free from being exposed from the encapsulation layer 35 according to requirements, but the present disclosure is not limited to as such.

Therefore, in the electronic package 3 of the embodiment, a routing structure 30 is stacked on the second side 20b of the carrier structure 20, and the layout width R2 of the routing structure 30 is also less than the layout width D of the carrier structure 20, so as to increase the layout space of the second side 20*b* of the carrier structure 20, and, on the outer side 30*a* of the routing structure 30, the wire 39 is used as an electrical connection path between the carrier structure 20 and the routing structure 30 to replace a part of the support structures 33.

Figure 4A:
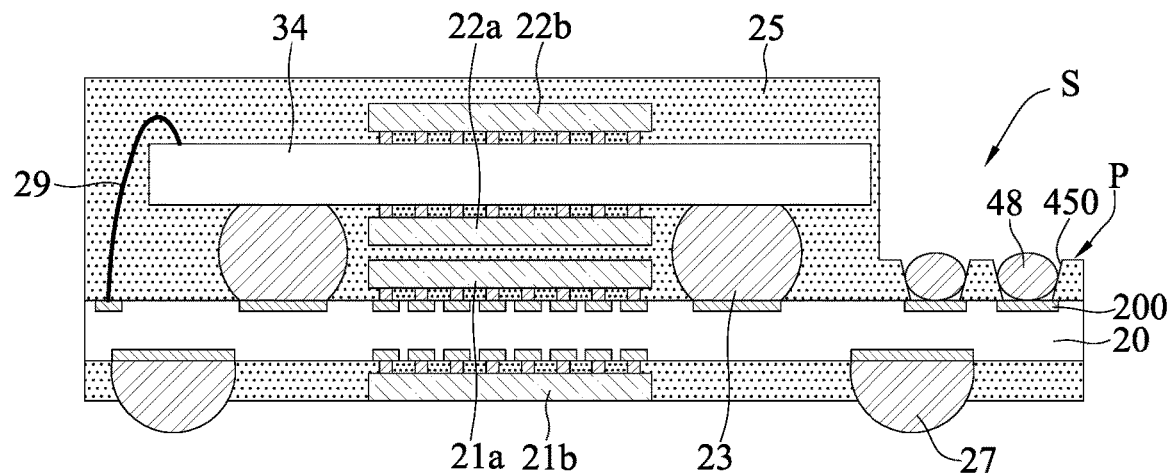
FIG. 4A and FIG. 4B are schematic cross-sectional views of an electronic package according to a fourth embodiment of the present disclosure.
Figure 4B:
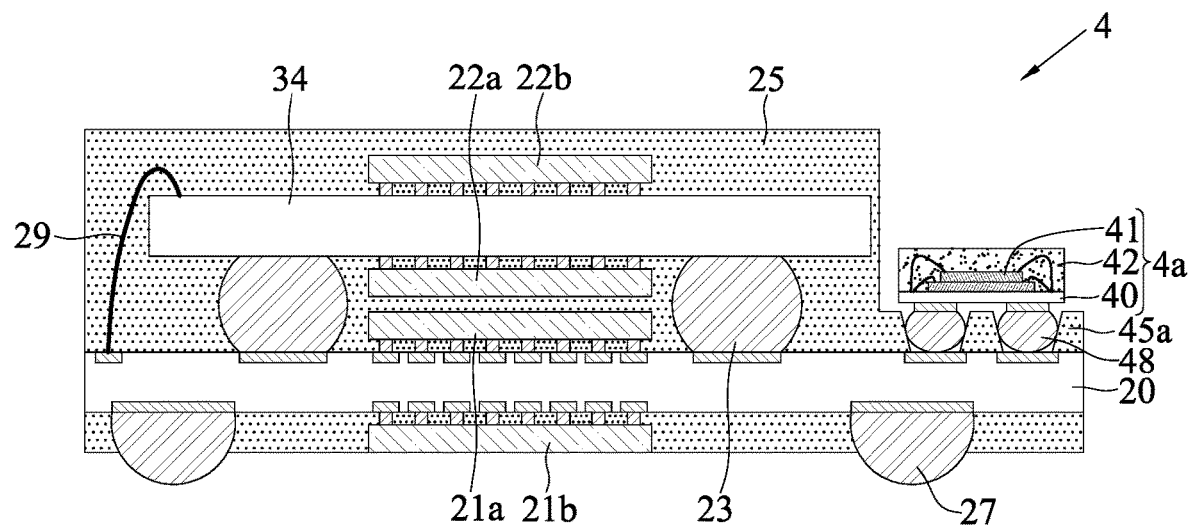

FIG. 4A and FIG. 4B are schematic cross-sectional views of an electronic package 4 according to a fourth embodiment of the present disclosure. The difference between the fourth embodiment and the above-mentioned embodiments lies in the design of the cladding layer, and other structures between the fourth embodiment and the above-mentioned embodiments are substantially the same, so the similarities will not be repeated.

As shown in FIG. 4A, the cladding layer 25 is formed with a notch at the accommodating space S, so that the outer appearance of the cladding layer 25 is uneven (e.g., the outer appearance of the cladding layer 25 is of a concave-convex shape), such as a stepped portion (e.g., a step-shaped portion) P, and the upper surface of the stepped portion P is lower than the upper surface of the cladding layer 25 corresponding to the circuit structure 34. Next, a plurality of openings 450 are formed on the upper surface of the stepped portion P, so that part of the routing layer 200 of the carrier structure 20 is exposed from the openings 450 for bonding a plurality of conductive elements 48 made of such as solder material to be used as a Through Molding Via (TMV) structure, such that the conductive elements 48 are electrically connected to the routing layer 200.

As shown in FIG. 4B, the functional element 26 is replaced by a package module 4*a*, and the package module 4*a* is bonded to the plurality of conductive elements 48 made of such as solder material.

In an embodiment, the package module 4*a* comprises a package substrate 40 bonded with and electrically connected to the conductive elements 48, semiconductor chips 41 electrically connected to the package substrate 40, and an encapsulant 42 encapsulating the semiconductor chips 41.

Figure 4C:
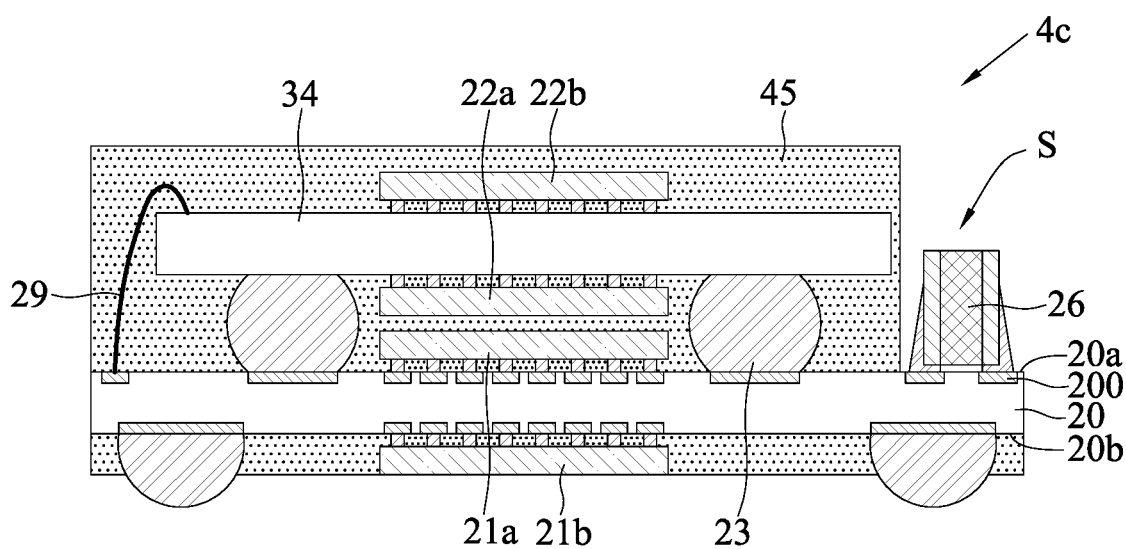
FIG. 4C is a schematic cross-sectional view showing another aspect of FIG. 4B.

Furthermore, in the electronic package 4*c* as shown in FIG. 4C, the cladding layer 45 can also be formed on the partial surface of the first side 20*a* of the carrier structure 20 but free from being formed on the accommodating space S, so that the cladding layer 45 encapsulates the circuit structure 34, the first electronic elements 21*a*, 21*b*, the wire 29, the second electronic elements 22*a*, 22*b* and the support structures 23, such that a portion of the routing layer 200 at the accommodating space S is exposed from the cladding layer 45 for arranging the functional element 26, that is, the cladding layer 45 does not cover the accommodating space S and is formed with a hollow area at the accommodating space S and does not cover the functional element 26.

Therefore, since the routing layer 200 on the first side 20*a* of the carrier structure 20 at the accommodating space S is exposed from the cladding layer 25, 45, the electronic packages 4 and 4*c* of the embodiment are advantageous for connecting the package module 4*a* or the functional element 26 with various functions. For example, the functional element 26 can be not only a passive element, but also an electrical connector, so as to enhance the configuration flexibility of the system assembly. Alternatively, the functional element 26 can be a sensor element, such as a light sensor or an air pressure sensor, or even other elements that cannot be placed in the cladding layer 25.

In addition, part of the routing layer 200 at the accommodating space S is exposed from the openings 450 or the cladding layer 45, so that the routing layer 200 can be used as a test contact (or electrical connection pad) to directly connect a test device, thus simplifying a test fixture or eliminating the need for a test fixture.

Figure 5A:
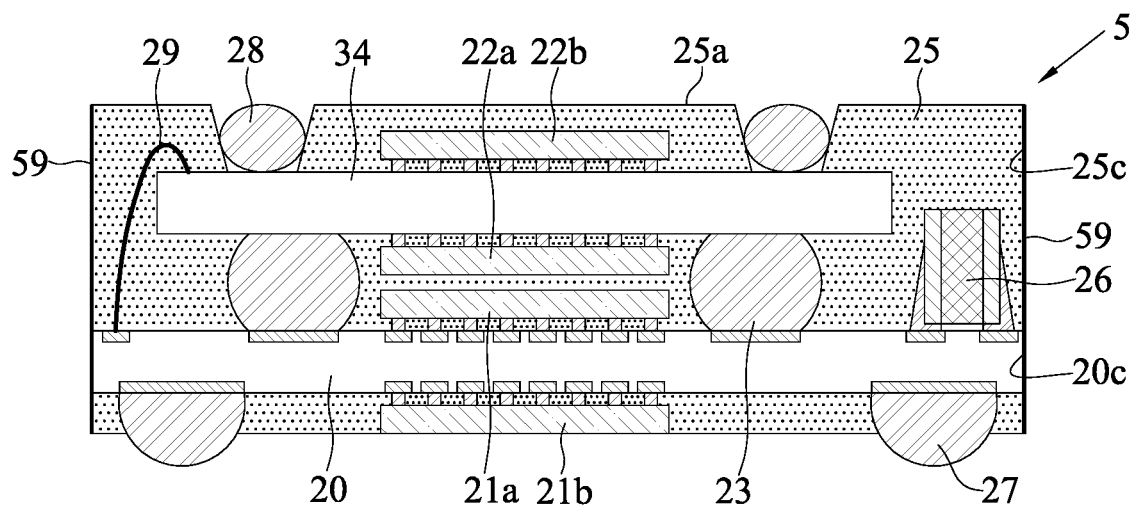
FIG. 5A, FIG. 5B and FIG. 5C are schematic cross-sectional views showing different aspects of an electronic package according to a fifth embodiment of the present disclosure.
Figure 5B:
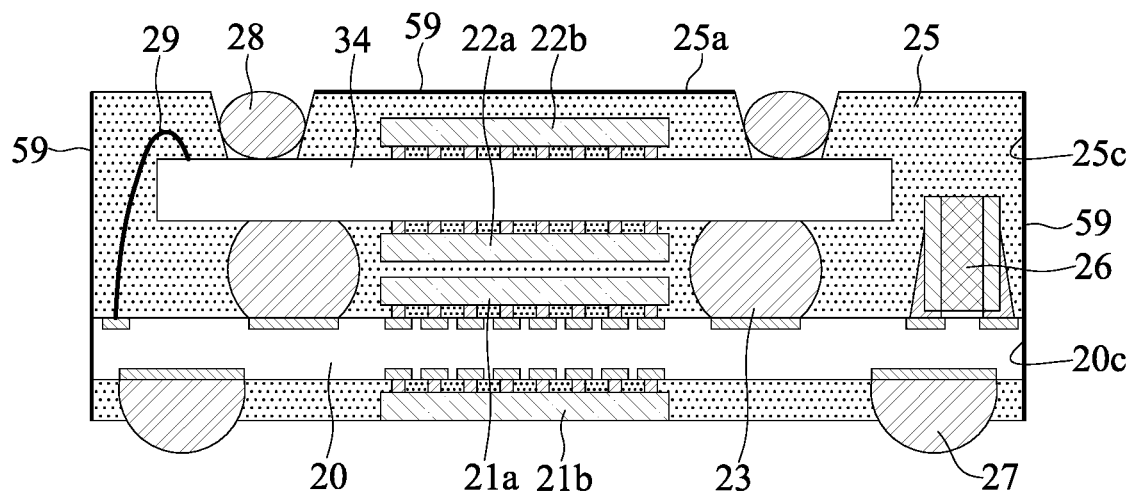
Figure 5C:
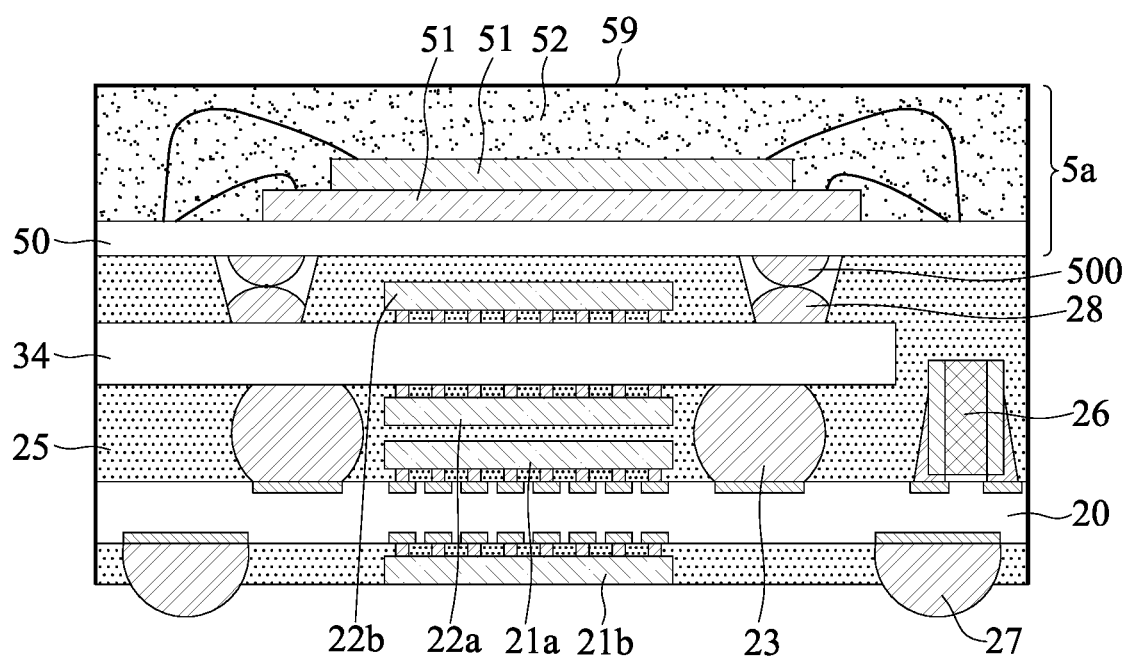

FIG. 5A, FIG. 5B and FIG. 5C are schematic cross-sectional views of an electronic package 5 according to a fifth embodiment of the present disclosure. The difference between the fifth embodiment and the above-mentioned embodiments lies in a newly added shielding structure 59, and other structures between the fifth embodiment and the above-mentioned embodiments are substantially the same, so the similarities will not be repeated.

As shown in FIG. 5A and FIG. 5B, based on the electronic package 2*b* shown in FIG. 2B, a metal layer is formed on the surface of the cladding layer 25 as required to serve as a shielding structure 59 to prevent electromagnetic interference (EMI).

In an embodiment, as shown in FIG. 5A, the shielding structure 59 can be formed on a side surface 25*c* of the cladding layer 25 and extend to a side surface 20*c* of the carrier structure 20. Further, as shown in FIG. 5B, the shielding structure 59 can even be formed on an area that the upper surface 25*a* of the cladding layer 25 corresponds to the first and second electronic elements 21*a*, 21*b*, 22*a*, 22*b* according to requirements, but the shielding structure 59 is free from being formed on other areas of the upper surface 25*a* of the cladding layer 25.

Furthermore, in other embodiments, as shown in FIG. 5C, if a package module 5*a* is disposed on the conductive elements 28, the shielding structure 59 can extend to the outer surface of the package module 5*a*, so as to protect semiconductor chips 51 in the package module 5*a* from electromagnetic interference (EMI).

It should be understood that the shielding structure 59 is applicable to possible aspects of all the embodiments, and is not limited to the electronic package 2*b* shown in FIG. 2B.

Figure 6A:
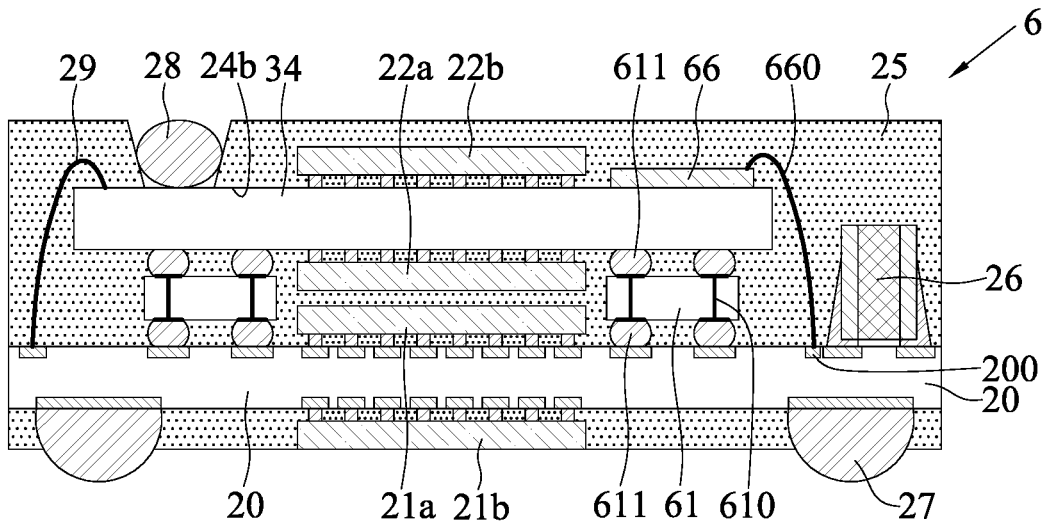
FIG. 6A, FIG. 6B and FIG. 6C are schematic cross-sectional views showing different aspects of an electronic package according to a sixth embodiment of the present disclosure.
Figure 6B:
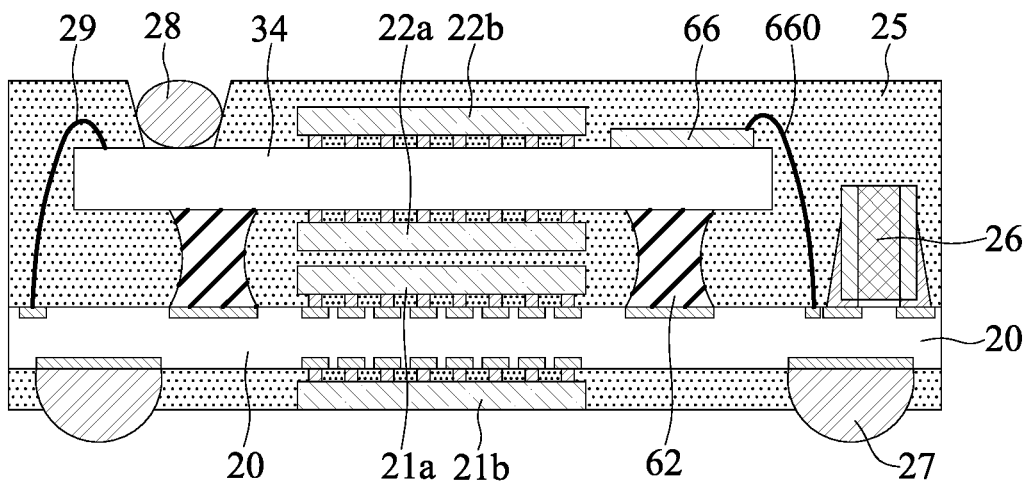
Figure 6C:
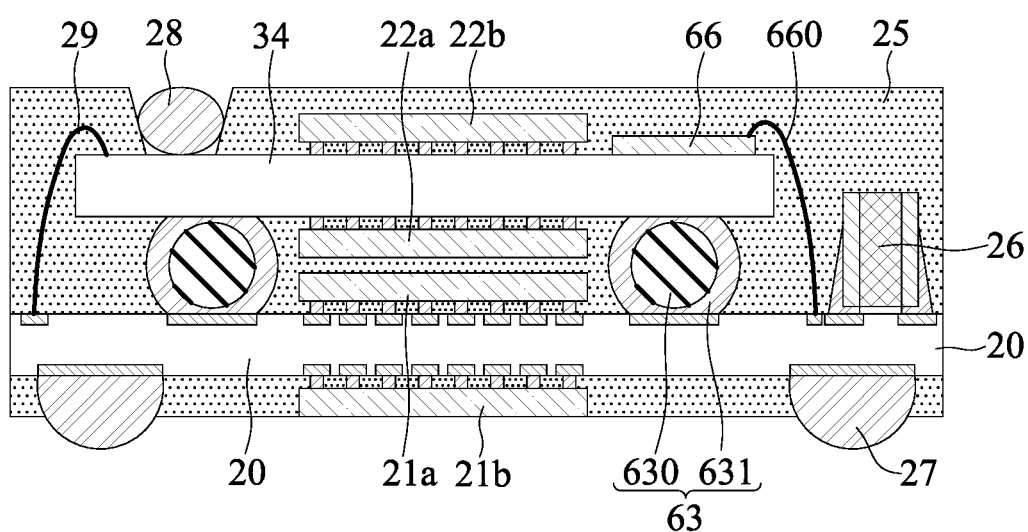

FIG. 6A, FIG. 6B and FIG. 6C are schematic cross-sectional views of an electronic package 6 according to a sixth embodiment of the present disclosure. The difference between the sixth embodiment and the above-mentioned embodiments lies in the aspect of the support structure, and other structures between the sixth embodiment and the above-mentioned embodiments are substantially the same, so the similarities will not be repeated.

As shown in FIG. 6A, support structures 61 are circuit boards, and the conductive traces 610 of the support structures 61 are bonded to the routing layer 200 on the first side 20*a* of the carrier structure 20 and the circuit layer of the circuit structure 34 by means of conductors 611 made of such as solder material.

In an embodiment, the number of the conductive elements 28 can be reduced on the second side 24*b* of the circuit structure 34, so that more functional elements 66 can be arranged. For example, the functional element 66 is a semiconductor chip, which is disposed on the circuit structure 34 and is electrically connected to the routing layer 200 of the carrier structure 20 via a wire 660 in a wire-bonding manner.

Furthermore, as shown in FIG. 6B, support structures 62 can also be conductive pillars such as metal pillars, which can be obtained by etching copper lead frames or electroplating copper pillars. Alternatively, as shown in FIG. 6C, support structures 63 are copper core balls, which are formed by covering copper blocks 630 with solder material 631. It should be understood that there are various aspects of support structures, and the present disclosure is not limited to as such.

To sum up, in the electronic package of the present disclosure, the layout width of the circuit structure is less than the layout width of the carrier structure, so that an accommodating space is formed above the first side of the carrier structure for arranging other functional elements. Therefore, the space for arranging the electronic elements of the present disclosure is not limited by the height of the support structures, so that electronic elements of different specifications can be arranged on the first side of the carrier structure according to requirements.

Furthermore, since the space for arranging the electronic elements is not limited by the height of the support structures, the width of the support structures can be designed to be miniaturized, so as to reduce the layout areas of the support structures on the first side of the carrier structure, so that other electronic elements can be added on the first side of the carrier structure according to requirements.

Furthermore, by using the design of double-sided compression molding for the cladding layer, a plurality of first electronic elements can be arranged on the first side and the second side of the carrier structure, and a plurality of second electronic elements can be arranged on the first surface and the second surface of the circuit structure, so that the electronic package of the present disclosure can effectively increase the packaging density to meet the requirements of multi-functional end products. In addition, by a four-sided compression molding for the cladding layer relative to the carrier structure and the circuit structure, the overall structural strength of the electronic package can be improved, so as to reduce the warpage of the multilayer stack structure.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic package, comprising:
   a carrier structure having a routing layer and defined with a first side and a second side opposing the first side;
   a plurality of first electronic elements disposed on the first side and the second side of the carrier structure respectively and electrically connected to the routing layer;
   support structures disposed on the first side of the carrier structure and electrically connected to the routing layer;
   a circuit structure having a first surface and a second surface opposing the first surface and stacked on the first side of the carrier structure with the first surface via the support structures, wherein the support structures are electrically connected to the circuit structure, and a layout width of the circuit structure is less than a layout width of the carrier structure, such that an accommodating space is formed above the first side of the carrier structure;
   a plurality of second electronic elements disposed on the first surface and the second surface of the circuit structure respectively and electrically connected to the circuit structure; and
   a cladding layer formed on the first side and the second side of the carrier structure and on the first surface and the second surface of the circuit structure to encapsulate the plurality of first electronic elements, the plurality of second electronic elements and the support structures.

2. The electronic package of claim 1, further comprising a functional element disposed in the accommodating space on the first side of the carrier structure, wherein the functional element is electrically connected to the routing layer, wherein a height of the functional element relative to the first side of the carrier structure is greater than a height of the support structures relative to the first side of the carrier structure.

3. The electronic package of claim 1, wherein the cladding layer is formed with a plurality of openings on the second surface of the circuit structure, such that partial areas on the second surface of the circuit structure are exposed from the plurality of openings for bonding a plurality of conductive elements.

4. The electronic package of claim 1, wherein the circuit structure is electrically connected to the routing layer of the carrier structure via at least one wire.

5. The electronic package of claim 1, wherein the support structures are further disposed on the second side of the carrier structure for stacking an electronic module.

6. The electronic package of claim 1, wherein the cladding layer is formed with a stepped portion at the accommodating space, wherein an upper surface of the stepped portion is lower than an upper surface of the cladding layer corresponding to the circuit structure, and a plurality of openings are formed on the upper surface of the stepped portion, such that part of the routing layer of the carrier structure is exposed from the plurality of openings.

7. The electronic package of claim 6, further comprising a plurality of conductive elements disposed in the plurality of openings to connect to a package module, wherein the package module is electrically connected to the routing layer.

8. The electronic package of claim 1, wherein the cladding layer is formed on a partial surface of the first side of the carrier structure, such that the cladding layer is free from covering the accommodating space and is formed with a hollow area at the accommodating space.

9. The electronic package of claim 1, further comprising a shielding structure formed on the cladding layer.

10. The electronic package of claim 1, wherein the support structures are solder balls, conductive pillars, or copper core balls.

11. The electronic package of claim 1, wherein the support structures are circuit boards, and the support structures are bonded to the routing layer on the first side of the carrier structure and the circuit structure via conductors.

* * * * *